(12) United States Patent
Barringer et al.

(10) Patent No.: US 7,660,111 B2
(45) Date of Patent: Feb. 9, 2010

(54) REMOVABLE COOLING DUCT WITH INTERLOCKING DOVETAIL CONNECTIONS FOR AN AIR TIGHT THERMAL SEAL

(75) Inventors: Dennis R. Barringer, Wallkill, NY (US); Robert R. Genest, Poughkeepsie, NY (US); John J. Loparco, Poughkeepsie, NY (US); Wade H. White, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 11/947,299

(22) Filed: Nov. 29, 2007

(65) Prior Publication Data

US 2009/0141442 A1      Jun. 4, 2009

(51) Int. Cl.
*H05K 7/20* (2006.01)
*H05K 5/00* (2006.01)

(52) U.S. Cl. .............................. 361/679.49; 361/679.46; 361/690; 165/80.3; 454/184

(58) Field of Classification Search ................................
361/679.48–679.51, 690, 692, 694–695, 361/697, 719–720; 174/16.1, 252; 312/223.2, 312/236; 454/184
See application file for complete search history.

(56) References Cited

U.S. PATENT DOCUMENTS

| | | | |
|---|---|---|---|
| 6,464,578 B1 | 10/2002 | Chin et al. ................. 454/184 |
| 6,570,760 B1 | 5/2003 | Wang .......................... 361/687 |
| 6,587,335 B1 | 7/2003 | Nelson et al. ............... 361/687 |
| 6,785,145 B1 * | 8/2004 | Wong .......................... 361/752 |
| 6,871,879 B2 * | 3/2005 | Gan ............................. 285/189 |
| 6,930,882 B2 | 8/2005 | Broder et al. ............... 361/695 |
| 6,971,749 B2 * | 12/2005 | Russell et al. ................. 353/58 |
| 7,023,696 B2 | 4/2006 | Ko .............................. 361/695 |
| 7,050,300 B2 | 5/2006 | Hein .......................... 361/695 |
| 7,068,505 B2 | 6/2006 | Kosugi ....................... 361/690 |
| 7,457,114 B2 * | 11/2008 | Peng et al. ............. 361/679.48 |
| 2002/0134531 A1 | 9/2002 | Yanagida ................... 165/80.3 |
| 2004/0095723 A1 | 5/2004 | Tsai et al. .................... 361/695 |
| 2004/0240175 A1 | 12/2004 | Brovald et al. .............. 361/687 |

* cited by examiner

*Primary Examiner*—Jayprakash N Gandhi
*Assistant Examiner*—Robert J Hoffberg
(74) *Attorney, Agent, or Firm*—Geraldine D. Monteleone; Lily Neff

(57) ABSTRACT

A method and incorporated assembly is provided for cooling of an electronic device or component. The assembly comprises a thermal duct having a fixed duct portion and a removable duct portion. The portions each have complementary interlocking components to secure them to one another. Also a first attachment block is provided. The first attachment block has complementary interlocking portions with the fixed and removable duct portions such that the block can be secured at least partially to each of the fixed duct portion and the removable duct portion. A second attachment block is also provided that has a complementary interlocking portion with the removable duct portion. This second attachment block can be secured to one or more electronic devices requiring cooling.

18 Claims, 2 Drawing Sheets

REMOVABLE COOLING DUCT WITH INTERLOCKING DOVETAIL CONNECTIONS FOR AN AIR TIGHT THERMAL SEAL

BACKGROUND OF THE INVENTION

1. Field of the Invention

This invention relates to cooling of electronic packages and more particularly to cooling of electronic components used in a computing system environment.

2. Description of Background

The industry trend has been to continuously increase the number of electronic components inside computing systems environments. A computing system environment can simply comprise of a simple personal computer or be a complex network of large computers in processing communication with one another. While increasing the components inside a simple computing system environment does create some challenges, however, such an increase create many problems in computing system environments that include large computer complexes. In such instances many seemingly isolated issues affect one another, and have to be resolved in consideration with one another. This is particularly challenging in environments where the computers in the network are either packaged in a single assembly or housed and stored in close proximity.

One such particular challenge when designing any computing system environment is the issue of heat dissipation. Heat dissipation if unresolved, can result in electronic and mechanical failures that will affect overall system performance, no matter what the size of the environment. As can be easily understood, the heat dissipation increases as the packaging density increases. In larger computing systems environments, however, not only the number of heat generating electronic components are much larger than that of smaller environments, but thermal management solutions must be provided that take other needs of the system environment into consideration. Furthermore, improper heat dissipation can create a variety of other seemingly unrelated problems ranging from dynamic loading problems affecting structural rigidity of the computing system environment, to cost prohibitive solutions to provide proper air conditioning to customer sites where such computing system environments are being stored.

In some computing environments, heat dissipation issues are addressed by moving air over and at times through electronic devices and components that are to be cooled. In many instances, to properly cool an electronic device by moving air over and thru it, a thermal duct is used. In the prior art currently being used, the thermal duct is often sealed to the device. Unfortunately, in many instances, especially when servicing or installation of new components is involved, the thermal duct must be removed to access the components that are underneath it. This creates difficulties, especially in instances where the removal of the duct has to be repeated with some frequency. Consequently, a system and method is needed that allows for easy removal and re-installation of thermal ducts which are necessary in some applications.

SUMMARY OF THE INVENTION

The shortcomings of the prior art are overcome and additional advantages are provided through the provision of a method and incorporated assembly for cooling of an electronic device or component. The assembly comprises a thermal duct having a fixed portion and a removable portion. The portions each have complementary interlocking components to secure them to one another. Also a first attachment block is provided. The first attachment block has complementary interlocking portions with the first and second thermal duct portions such that the block can be secured at least partially to either/or thermal duct portion. A second attachment block is also provided that has a complementary interlocking portion with the removable duct portion. This second attachment block can be secured to one or more electronic devices requiring cooling. In one embodiment, a standoff can also be provided to address any height restrictions and or needs for the securing of the thermal duct. The standoff can be at least partially secured to the thermal duct and used to secure the thermal duct to a computer mounting board or plate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1:
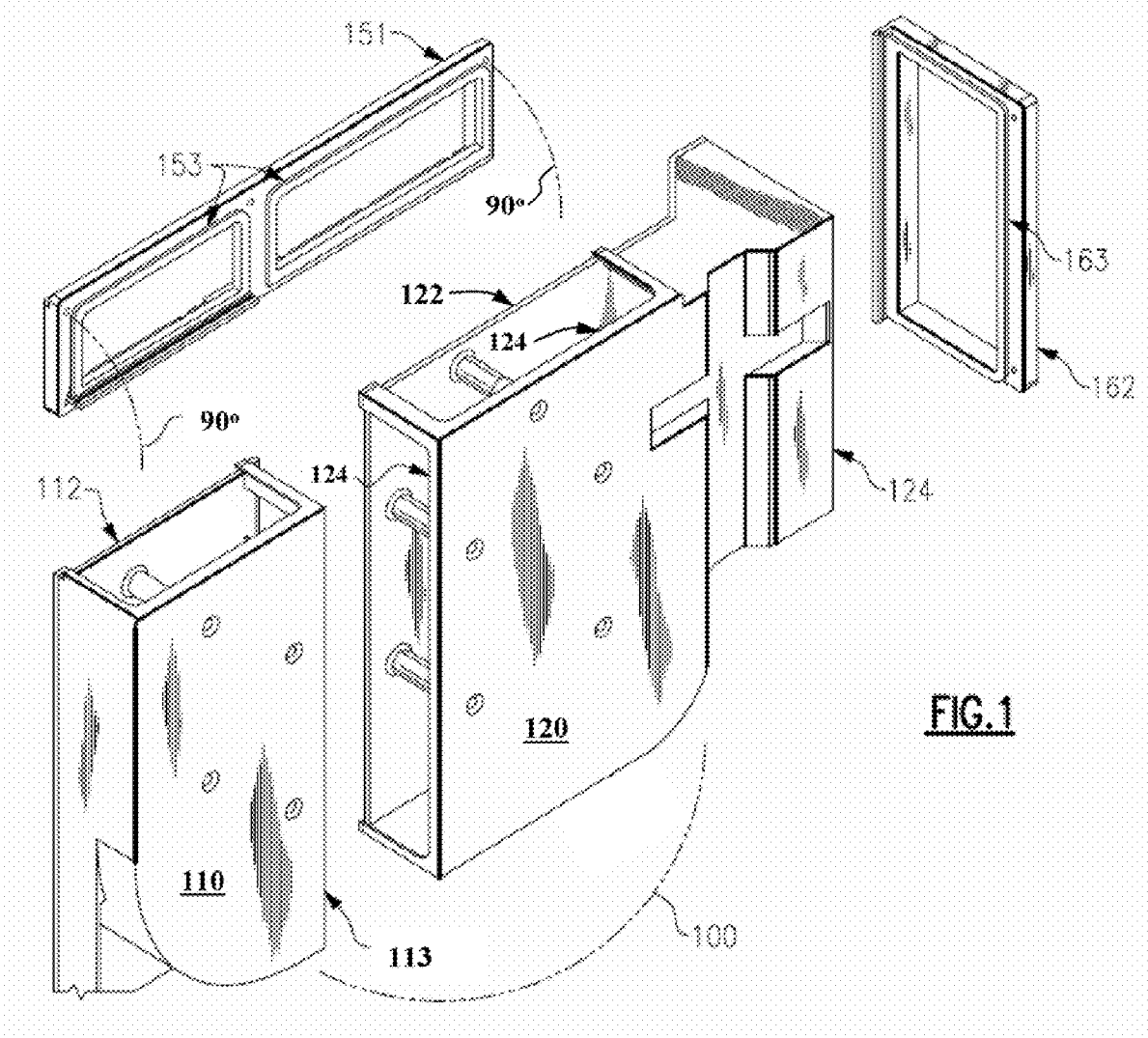
FIG. 1 is a perspective side view illustrations of a cooling assembly as per one embodiment of the present invention.

FIG. 1 is a side view perspective illustration of one embodiment of the present invention. The assembly in FIG. 1 is comprised of a variety of members, that when disposed in conjunction with one another, form a removable duct.

Thermal ducts, in general, are used in heating, ventilation and air cooling of devices to deliver and/or to remove air. Thermal ducts used to cool electronic devices are used in the same capacity, including the ones used in large computing environments. In prior years, these thermal ducts were disposed in desired areas and then sealed to optimize cooling. This was an adequate solution if the ducts were not to be removed, or at least not to be removed frequently. With the advent of technology, at least in computer industry, the need to repeatedly insert and remove these ducts has grown. An increased number of electronic components disposed in a very cramped and limited foot print has made it vital to remove these ducts during installation and service calls to reach areas behind the ducts or components being cooled by these ducts. Therefore, the need to have an easily removable cooling duct has become an important issue to address. The embodiment of FIG. 1 provides a removable cooling duct that can be repeatedly removed and replaced such as during service calls.

In FIG. 1, an interlocking cooling duct 100 is provided comprising of two interlocking ducting portions or components referenced by numerals 110 and 120 respectively. In one embodiment, the two portions or components 110 and 120 are complementary in shape and interlocking. In a preferred embodiment, the two portions or components are dovetailed in shape as shown in the figures. The illustration of FIG. 1 reflects such an embodiment.

In FIG. 1, the first portion 110 by way of example is provided to reflect having a female profile while the second portion 120 is its male counterpart. This arrangement is only provided as a way of example. In alternate embodiments other similar arrangements may also be achievable.

The first portion 110 comprises a fixed duct sub-assembly (hereinafter fixed duct or fixed duct portion) as shown and referenced by numeral 112. The second portion 120 comprises a removable duct sub-assembly as illustrated and referenced by numeral 122.

A first and second attachment blocks are also provided. As shown in FIG. 1, the first attachment block is referenced as 151 while the second attachment block is referenced as 162. The attachment blocks 151 and 162, as will be discussed later, are provided to attach to different components of a device or electronic component. In a preferred embodiment, both blocks 151 and 162 present a female type dovetail profile. This particular arrangement, however, can be altered in different embodiments to address particular needs.

It should be noted that the removable duct 122 sub-assembly (hereinafter removable duct 122) has several engagement attachments that are all collectively referenced as 124. In this embodiment, the engagement attachments 124 are provided on a plurality of different sides of the removable duct 122 to ensure a proper securing and fit with different components, as will be discussed. Mainly, one engagement attachment is provided to interlock with each attachment block (151 and 162) at least partially, while another engagement attachment 124 is provided to interlock with the fixed duct 112. In this example the removable duct 122 has a male profile on all sides, while both the fixed duct 112 and the attachment blocks 151 and 162 have a female profile. It is possible, however, for the removable duct 122 to have different profiles on different sides and for the attachment blocks 151 and 162, and the fixed duct 112 to have different profiles than those illustrated herein. In addition, in the embodiment of FIG. 1, the engagement attachment 124 that will engage with second attachment block 162 is more prominently visible, but the other engagement attachments 124 are similar in nature even though those engagement attachments may not be as easily visible.

First and second attachment blocks 151 and 162 are attached to fixed duct 112 and removable duct 122, respectively. Their placement, as will be seen later, will be such that the attachment blocks will be disposed on substantially perpendicular planes to one another. To ease understanding, in the illustrated FIG. 1, a legend is provided that shows the direction of the almost 90 degree rotation. The female type dovetail profiles of the first and second attachment blocks 151 and 162 are referenced as 153 and 163, respectively, as illustrated.

The interlocking cooling duct 100 is secured to the attachment blocks as will be discussed. The fixed duct 112 of the interlocking cooling duct 100 is secured on one side to the removable duct 122. On an adjacent side, the fixed duct 112, which is a part of the first portion 110, is partially secured to the first attachment block 151. In one embodiment, the fixed duct 112 would be fabricated such that a first portion of the first attachment block 151 and the fixed duct 112 are interlockingly secured to one another. The remaining portion (second portion) of the first attachment block 151 will be secured later to the removable duct 122 of the interlocking cooling duct 100, as will be discussed. To provide for better reference, the receiving part of the fixed duct 112 is referenced by numeral 113, although it is difficult to view this from the angle perspective of FIG. 1 as stated earlier. This receiving part 113 will interlock with one engagement attachment 124 of the removable duct 122, so as to interlockingly secure the removable duct 122 to the fixed duct 122.

In a preferred embodiment, the first attachment block 151 may be pre-attached to other components or mounted to a frame or frame-side before being attached to the fixed duct 112, but this is not a requirement. Indeed, the first attachment block 151 and fixed duct 112 can first be interlockingly secured to each other, if desired. To provide for better reference, the receiving part is referenced by numerals 113, although it is difficult to view this from the angle perspective of FIG. 1 (it is hidden). Similarly the engagement attachment part is referenced by numerals 124.

In a preferred embodiment, the fixed duct 112 in turn is then mounted to a mounting plate (not shown in FIG. 1) or other components for further securing. Any securing means known to those skilled in the art can be provided for this attachment. An example can be standoffs and screws but other securing means can be used. It should be noted that the first and second attachment blocks 151 and 162, respectively, in this embodiment, do not directly attach to fixed duct 112. However, the removable duct 122 as will be discussed will be in contact with the first and second attachment blocks 151 and 162, and the fixed duct 112 during its engagement phase.

The second attachment block 162 is then secured to the to-be-cooled device. In a preferred embodiment, as stated earlier, the first and second attachment blocks 151 and 162 will be on substantially perpendicular planes. The removable duct 122 of the interlocking cooling duct 100 is then disposed between the fixed duct portion 112 and the second attachment block 162. In the preferred embodiment, where an interlocking dovetail is used, the interlocking dovetail should become fully engaged to ensure full extent of the movement. At this point, the bottom of the first and second portions 110 and 120, respectively, are disposed such that it will be physically impossible to move them any further. In some embodiments, it may be necessary to exert some amount of force to ensure complete engagement of the first and second portions 110 and 120.

Once the first and second portions 110 and 120 are fully engaged, it is possible to remove and reinsert the removable duct 122. In this embodiment, the removable duct 122 would be removed by pulling it, by itself, and in a substantially straight upward direction until it is completely separated from the assembly and disengaged from it.

To replace the removable duct 122 back into its previous position, such as at the end of a service call completion, the removable duct 122 is reinserted by aligning the dovetail features of the first and second attachment blocks 151 and 162 with the engagement attachments 124. The removable duct 122 is then again disposed between the fixed duct 112 and the second attachment block 162 until the dovetail features are engaged to the full extent of the movement. Some force or pressure can be exerted until the two bottoms of the first and second portions 110 and 120 no longer can be moved any closer.

Figure 2:
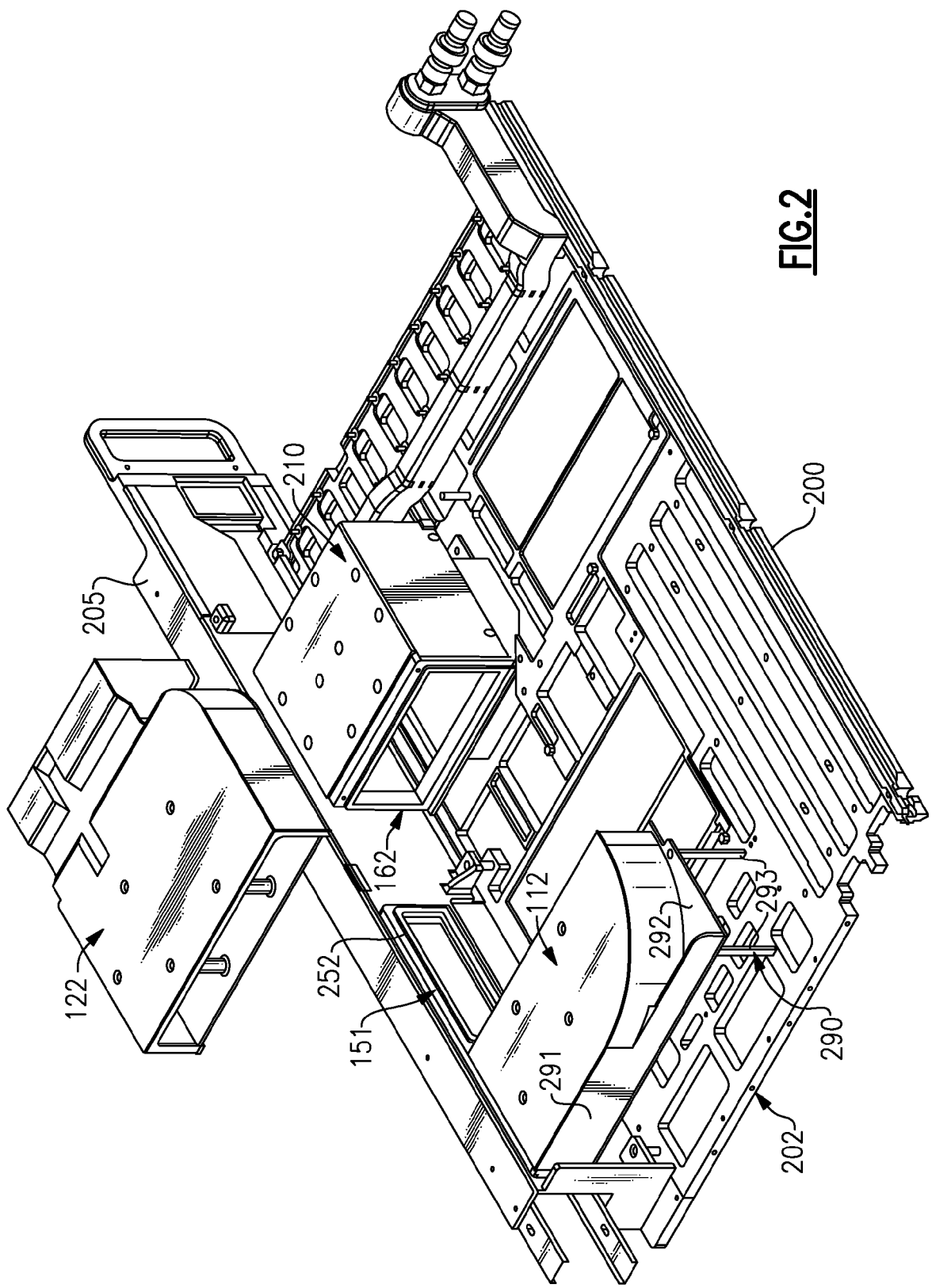
FIG. 2 is a perspective side view illustration of the assembly of FIG. 1 disposed in a computing system environment.

FIG. 2 is an illustration of another side view perspective of the cooling assembly of FIG. 1, as placed in a computer environment. The illustration of FIG. 2 provides an example of the use of the present invention and is solely provided to ease understanding. Therefore, it should not be used to place any limitations on the scope of the present invention as previously discussed.

In FIG. 2, a computer card or board is illustrated and referenced by numeral 200. The board 200 comprises a number of components. To ease understanding, component referenced by numeral 210 is chosen in this embodiment to represent the "to-be-cooled" component. The board also is comprised of a mounting surface 202 that is also interchangeably referenced herein as mounting plate 202. Many of the to be cooled devices and components, including component 210, that is selected by way of example here, are secured to the mounting plate 202 as shown. It should be noted that more than one component and/or device can be selectively cooled using the teachings of the present invention and the example provided in this figure is made simple to ease understanding.

As can be seen in the illustration of FIG. 2, the first and second blocks 151 and 162, respectively, are already secured to different locations on the board 200. The second attachment block 162 is secured to the "to be cooled" device 210. The first attachment block 151 is secured to the side 205 of the board 200 or mounting plate 202 as shown, but other arrangements are possible in alternate embodiments as was earlier discussed.

As shown in FIG. 2, the two attachment blocks 151 and 162 are disposed as to be substantially perpendicular to one another. Fixed duct 112 is also secured to the board 200 as shown. In this example, fixed duct 112 is secured directly to the mounting plate 202, while other arrangements are possible.

In addition, as can be viewed from the example illustrated in FIG. 2, the fixed duct 112 is partially secured to first attachment block 151. A portion of the first attachment block 151 (referenced separately as 252) remains free so as to be later secured to the removable duct 122. The fixed duct 112 and the attachment blocks 151 and 162 are disposed such that the first attachment block 151 is disposed on a plane between the fixed duct 112 and the second attachment block 162.

Furthermore, in this embodiment, the placement of the fixed duct 112 is such that it is disposed on a substantially parallel plane to that of the second attachment block 162. The fixed duct 112 is disposed on a substantially perpendicular plane with that of the first attachment block 151 as was discussed earlier in conjunction with the relative placement of the two attachment blocks.

It should also be noted that to ease accessibility to other components and/or to better provide an interlocking fit for the interlocking cooling duct 100, at least part of the interlocking cooling duct 100 can be mounted on a standoff. To provide an example of this concept, as shown in FIG. 2, the fixed duct 112 is shown to be mounted on a standoff 290. In this example, the standoff comprises of a mounting surface 292 with sides 291 and legs 293 as referenced. The standoff 290 is at least partially mounted (by its legs 293) to the mounting plate 202 using means known to those skilled in the art. In this example, the legs are adjusted to achieve a desired height. They can be designed to address even a plurality of adjustment heights. The use of the standoff provides for an optional alternate embodiment. Other standoff arrangements can also be provided if desired to address specific electronic component arrangements and needs.

In the view provided by the illustration of FIG. 2, the removable duct 122 is disengaged. This view can happen at a point either prior to installation of the duct itself, or in response to a service call such that access can be made to the "to-be-cooled" component 210 or other components that can be disposed in locations where the placement of removable duct 122 makes their servicing difficult. Therefore, the removable duct 122 of the interlocking cooling duct 100 is illustrated in a suspended state above the board 200.

As was discussed in conjunction with the embodiment of FIG. 1, a first time installation or a re-application of the removable duct 122 would be easily achieved at this point by inserting the removable duct 122 in the opening between the fixed duct 112 and the two attachment blocks 151 an 162.

Once disposed in place, the engagement attachments 124 of the removable duct 122 (in this case the male counterparts), will easily engage not just the second attachment block 162, but also the fixed duct 112 and the first attachment block 151 on different sides.

Once the removable duct 122 is disposed in place and the interlocking parts engagement attachments 124 are engaged with one another, it may be necessary to exert some pressure to ensure that the dovetail feature is engaged to the full extent of movement, as discussed earlier. This point will happen when the bottom of the removable duct 122 is firmly bottomed out on all sides with the first and second attachment blocks 151 and 162, and the fixed duct 112. In an alternate embodiment, it is possible to have a retracting interlocking portion on the removable duct 122 that is fully retracted while the removable duct 122 is being installed or removed, but is fully extended once the removable duct 122 is disposed between the fixed duct 112 and the second attachment block 162 such that one or all engagement attachments 124 extend into the receiving counterparts on one or a plurality of sides. This is to ensure a very tight and secure fit that does not require application of additional force. In such a case, one or more, release buttons can be provided to retract or fully expand the retracting interlocking portion. Other arrangement as known to those skilled in the art is possible.

As before, once it is desired to remove the removable duct 122, it can be simply disengaged and then pulled out until it becomes completely separated as shown in FIG. 2.

Among many advantages as discussed earlier, the assembly and the method of arrangement of the interlocking cooling duct 100 in the present invention, allows for one or more electronic devices and/or components to be properly cooled by moving air over and through them using a thermal duct that does not require sealing. In other words, the present invention does not require thermal foams or other components that can be costly and difficult to apply.

While the preferred embodiment to the invention has been described, it will be understood that those skilled in the art, both now and in the future, may make various improvements and enhancements which fall within the scope of the claims which follow. These claims should be construed to maintain the proper protection for the invention as first described.

What is claimed is:

1. A removable cooling assembly used for cooling of electronic devices, comprising:
   a thermal duct comprising of a fixed duct portion and a removable duct portion;
   said fixed and removable duct portions having complementary interlocking components such that the fixed duct portion and the removable duct portion can be secured to one another;
   a first attachment block having first and second female dovetailed interlocking portions, wherein the first female dovetailed interlocking portion is configured to engage with the fixed duct portion and the second female dovetailed interlocking portion is configured to engage with the removable duct portion such that said first attachment block can be secured at least partially to each of the fixed duct portion and the removable duct portion;
   a second attachment block having a third female dovetailed interlocking portion, the third female dovetailed interlocking portion of the second attachment block being configured to engage with said removable duct portion,
   wherein said second attachment block is configured to be attached to one or more electronic devices requiring cooling.

2. The assembly of claim 1, wherein said first attachment block can be secured to a mounting plate.

3. The assembly of claim 1, wherein said thermal duct can be at least partially secured to a mounting plate.

4. The assembly of claim 3, wherein said thermal duct can be at least partially secured to the mounting plate via a standoff having a plurality of legs, and wherein said standoff is adjustable in height.

5. The assembly of claim 4, wherein said standoff further comprises a mounting surface and sides for housing said fixed duct portion.

6. The assembly of claim 1, wherein said removable duct portion further comprises a plurality of interlocking components.

7. The assembly of claim 6, wherein at least two of the plurality of interlocking components of the removable duct portion are on substantially perpendicular planes.

8. The assembly of claim 6, wherein at least two of the plurality of interlocking components of the removable duct portion are on substantially parallel planes.

9. The assembly of claim 6, wherein at least one of the plurality of interlocking components of said removable duct portion is retractable.

10. The assembly of claim 1, wherein the interlocking component of said removable duct portion that interlocks with the complementary interlocking component of the fixed duct portion has a male profile.

11. The assembly of claim 1, wherein the interlocking component of said fixed duct portion that is to interlock with the complementary interlocking component of said removable duct portion has a female profile.

12. The assembly of claim 1, wherein said interlocking component of said removable duct portion has a male profile.

13. The assembly of claim 1, wherein said interlocking component of said fixed duct portion has a female profile.

14. The assembly of claim 1, wherein said removable duct portion is disposed in contact with the first attachment block on a first side, the second attachment block on a second side and the fixed duct portion on a third side.

15. The assembly of claim 14, wherein the first attachment block and the second attachment block are on substantially perpendicular planes.

16. The assembly of claim 14, wherein the second attachment block and the fixed duct portion are on substantially parallel planes.

17. The assembly of claim 1, wherein said removable duct portion further comprises a plurality of engagement attachment parts and wherein at least two of the plurality of engagement attachment parts have a male dovetailed profile so as to interlock with the second and third female dovetailed interlocking portions.

18. A method of cooling electronic components disposed on a mounting board, the method comprising:
 disposing a plurality of attachment blocks such that at least one block is secured to a component that is to be cooled, said plurality of attachment blocks including a first attachment block having first and second dovetailed interlocking portions and a second attachment block having a third dovetailed interlocking portion wherein the first attachment block and the second attachment block are disposed substantially perpendicular to one another;
 providing a thermal duct having a fixed duct portion and a removable duct portion, said fixed duct portion and removable duct portion having complementary interlocking parts so that the fixed and removable duct portions can be secured to each other;
 disposing said removable duct portion in contact with said fixed duct portion on a first side, said first attachment block on a second side and said second attachment block on a third side such that cooling air flows through said thermal duct to said component that is to be cooled,
 wherein said removable duct portion can be inserted into or removed from said contact with said fixed duct portion, said first attachment block and said second attachment block.

* * * * *